(12) United States Patent
Miyano et al.

(10) Patent No.: US 7,979,047 B2
(45) Date of Patent: Jul. 12, 2011

(54) SAMPLING FILTER

(75) Inventors: Kentaro Miyano, Kanagawa (JP);
Yoshifumi Hosokawa, Kanagawa (JP);
Katsuaki Abe, Osaka (JP); Akihiko Matsuoka, Kanagawa (JP)

(73) Assignee: Panasonic Corporation, Osaka (JP)

( * ) Notice: Subject to any disclaimer, the term of this patent is extended or adjusted under 35 U.S.C. 154(b) by 580 days.

(21) Appl. No.: 12/097,109

(22) PCT Filed: Dec. 12, 2006

(86) PCT No.: PCT/JP2006/324765
§ 371 (c)(1),
(2), (4) Date: Jun. 12, 2008

(87) PCT Pub. No.: WO2007/072712
PCT Pub. Date: Jun. 28, 2007

(65) Prior Publication Data
US 2008/0299937 A1    Dec. 4, 2008

(30) Foreign Application Priority Data

Dec. 13, 2005  (JP) ................................. 2005-359190
Nov. 24, 2006  (JP) ................................. 2006-317276

(51) Int. Cl.
*H04B 1/16* (2006.01)
*H04K 3/00* (2006.01)

(52) U.S. Cl. .......................... 455/334; 327/554; 333/173

(58) Field of Classification Search .................. 455/334; 327/552–554; 333/173
See application file for complete search history.

(56) References Cited

U.S. PATENT DOCUMENTS

| 6,181,740 B1 | 1/2001 | Yasuda | |
|---|---|---|---|
| 6,414,541 B1 * | 7/2002 | Arvidsson et al. | 327/554 |
| 7,411,444 B2 * | 8/2008 | Muhammad et al. | 327/552 |
| 2009/0021296 A1 * | 1/2009 | Miyano et al. | 327/553 |

FOREIGN PATENT DOCUMENTS

| JP | 58-107712 | 6/1983 |
|---|---|---|
| JP | 03-160814 | 7/1991 |
| JP | 2000-031788 | 1/2000 |
| JP | 1164707 | 12/2001 |
| JP | 2003-510933 | 3/2003 |

OTHER PUBLICATIONS

International Search Report Dated Mar. 20, 2007.

* cited by examiner

*Primary Examiner* — Lee Nguyen
(74) *Attorney, Agent, or Firm* — Pearne & Gordon LLP

(57) ABSTRACT

The present invention aims at providing a sampling filter capable of changing a filtering characteristic without use of a complicate waveform as a control signal. A sampling filter 100 has a control section 140, a plurality of integrators, and a plurality of switches. An input current is accumulated in a plurality of capacitors in one clock; adds up electric charges accumulated in the integrators in several preceding clocks to one preceding clock; and outputs a result of addition. When electric charges are accumulated in the integrators in each clock, output electric charges can be subjected to, while being weighted, addition by switching an electric current to be input, so that the filtering characteristic is changed.

13 Claims, 14 Drawing Sheets

FIG. 3

| CLOCK (TIMING) | | 1 | 2 | 3 | 4 | 5 |
|---|---|---|---|---|---|---|
| CHARGE SWITCH | 1700 TO 1703 (GROUP 1) | ○ | | | | |
| | 1704 TO 1707 (GROUP 2) | | ○ | | | |
| | 1708 TO 1711 (GROUP 3) | | | ○ | | |
| | 1712 TO 1715 (GROUP 4) | | | | ○ | |
| | 1716 TO 1719 (GROUP 5) | | | | | ○ |
| DISCHARGE SWITCH | 1800 (GROUP 1) | | ○ | | | |
| | 1801 | | | ○ | | |
| | 1802 | | | | ○ | |
| | 1803 | | | | | ○ |
| | 1804 (GROUP 2) | | | ○ | | |
| | 1805 | | | | ○ | |
| | 1806 | | | | | ○ |
| | 1807 | ○ | | | | |
| | 1808 (GROUP 3) | | | | ○ | |
| | 1809 | | | | | ○ |
| | 1810 | ○ | | | | |
| | 1811 | | ○ | | | |
| | 1812 (GROUP 4) | | | | | ○ |
| | 1813 | ○ | | | | |
| | 1814 | | ○ | | | |
| | 1815 | | | ○ | | |
| | 1816 (GROUP 5) | ○ | | | | |
| | 1817 | | ○ | | | |
| | 1818 | | | ○ | | |
| | 1819 | | | | ○ | |

FIG. 14

| CLOCK (TIMING) | | 1 | 2 | 3 | 4 | 5 | 6 | 7 | 8 | 9 | 10 |
|---|---|---|---|---|---|---|---|---|---|---|---|
| CHARGE SWITCH | 1700 TO 1703 (GROUP 1) | O | | | | | O | | | | |
| | 1704 TO 1707 (GROUP 2) | | O | | | | | O | | | |
| | 1708 TO 1711 (GROUP 3) | | | O | | | | | O | | |
| | 1712 TO 1715 (GROUP 4) | | | | O | | | | | O | |
| | 1716 TO 1719 (GROUP 5) | | | | | O | | | | | O |
| DISCHARGE SWITCH | 1800 1801 1802 1803 (GROUP 1) | | | O | | O | | O | | O | |
| | 1804 1805 1806 1807 (GROUP 2) | O | | O | | O | | | | O | |
| | 1808 1809 1810 1811 (GROUP 3) | O | | | | O | | O | | | O |
| | 1812 1813 1814 1815 (GROUP 4) | O | | O | | O | | | | O | |
| | 1816 1817 1818 1819 (GROUP 5) | O | | O | | | | O | | O | |

SAMPLING FILTER

TECHNICAL FIELD

The present invention relates to a sampling filter whose frequency characteristic is variable.

BACKGROUND ART

A sampling filter that chronologically discretizes a signal, to thus perform frequency conversion and filtering, is used in a radio communication device for mobile communications or the like. A sampling filter, such as that described in connection with Patent Document 1, has hitherto been available as a related-art sampling filter. FIG. 7 shows a related-art sampling filter described in connection with Patent Document 1.

In FIG. 7, the related-art sampling filter has a switch 2A, a switch 2B, an integrator 3, a weighting and sampling (W&S) element 6, and a control signal generator 7. Processing pertaining to three processes; namely, a reset process, a sampling process, and a holding process, is performed by a clock signal, a reverse clock signal, a W&S signal, and a reset signal which are generated by the control signal generator 7.

A filtering characteristic of the sampling filter is determined by a weighting function. Further, the weighting function is dependent on a combination of the W&S element 6 and a W&S signal, and the W&S signal conforms to; for example, three weighting functions (a constant function, a gradient function, and a Gaussian function). A signal current passing through the W&S element 6 is zero outside a sampling window and weighted in the sampling window in accordance with a weighting function (the constant function, the gradient function, and the Gaussian function). Thus, the filtering characteristic can be altered by weighting an output from the W&S element 6 by means of the W&S signal.

Patent Document 1: JP-T-2003-510933 (pg. 31, FIG. 2A)

DISCLOSURE OF THE INVENTION

Problem that the Invention is to Solve

However, under the related-art method described in connection with Patent Document 1, a complicate waveform, such as a gradient waveform and a Gaussian waveform, must be prepared as the W&S signal used for altering a filtering characteristic, and the width of a clock signal must be finely controlled.

The present invention has been conceived in view of the circumstance and aims at providing a sampling filter capable of changing a filtering characteristic without use of a complicate waveform as a control signal.

Means for Solving the Problem

A sampling filter of the present invention is a sampling filter whose filtering characteristic is determined in accordance with an output from integrators, the filter comprising a plurality of integrators that integrate an electric current; charge switches provided at input stages of the integrators; discharge switches provided at output stages of the integrators; and a control section that controls the charge switches and the discharge switches for each of the integrators, wherein the control section performs control so as to charge the integrators with different amounts of electric charges at the same timing and discharge different amounts of electric charges from the plurality of integrators at different timings.

According to the configuration, the plurality of integrators are charged with different amounts of electric charges on every clock. Hence, accumulated electric charges are weighted on a per-integrator basis, and the thus-added electric charges can be output, so that a filtering characteristic can be changed by a control signal that is a mere rectangular wave. Consequently, the control section that controls the sampling filter can be implemented by a simple configuration. Further, the electric charges that have been added while being weighted are subjected to convolution, whereby weighting can be utilized.

In the sampling filter of the present invention, the plurality of integrators form (N+1) integrator groups, each of the integrator groups is made up of N (N is an integer of two or more) integrators; and the control section performs control of charging integrators belonging to one integrator group and of adding and outputting electric charges accumulated in N integrators which are selected one by one from each of N integrator groups except the one integrator group being in a charging process every one clock. Moreover, the sampling filter of the present invention further includes a plurality of current sources, and different amounts of electric charges are input to the plurality of integrators every one clock.

According to the configuration, an input current is accumulated in N integrators on every clock; electric charges accumulated in the integrators in N preceding clocks to one preceding clock are added: and a result of addition is output. Further, different amounts of electric charges are accumulated in the plurality of integrators on a per-lock basis, whereupon output electric charges can be added while being weighted, so that a filtering characteristic can be altered.

Moreover, in the sampling filter of the present invention, the control section performs control so that output electric charges "y" are expressed as $y = a_1 + a_2 z^{-1} + \ldots + a_2 z^{-N+2} + a_1 z^{-N+1}$ where $1 \leq M \leq (N/2)$ N=2M: an even number; and
$1 \leq M \leq ((N+1)/2)$ N=2M−1: an odd number,
wherein electric charges integrated by the plurality of integrators in one clock are $a_1$ to $a_M$.

According to the configuration, the filtering characteristic can be changed by altering the coefficients $a_1$, $a_2$, and the like, corresponding to electric charges integrated by the integrators.

The sampling filter of the present invention further includes a plurality of current sources, and the control section switches an electric current input to the integrators by switching the current sources.

According to the configuration, amounts of electric charges accumulated in the respective integrators can be changed by switching the current sources, so that the filtering characteristic can be altered.

The sampling filter of the present invention further includes a current source, wherein the control section switches an electric current input to the integrators by switching a voltage-current characteristic of the current source.

According to the configuration, amounts of electric charges accumulated in the respective integrators can be changed without provision of a plurality of current sources, so that the filtering characteristic can be altered.

The sampling filter of the present invention further includes a current source, wherein the integrators have different capacitance values to each other; and the control section switches an electric current input to the integrators by switching the integrators.

According to the configuration, amounts of electric charges accumulated in the respective integrators can be changed by switching the integrators, so that the filtering characteristic can be altered.

The sampling filter of the present invention further includes a plurality of changeover switches for switching the integrators.

According to the configuration, the voltage-current conversion section is united by switching the integrators of different capacitance values through use of changeover switches, thereby achieving a simple configuration.

Further, in the sampling filter of the present invention, the control section performs control operation so as to perform resetting operation without outputting electric charges accumulated in the integrators at a predetermined timing.

According to the configuration, a decimation ratio can be changed by means of timing control.

In the sampling filter of the present invention, the control section charges different integrators with positive electric charges and negative electric charges in one clock so that output electric charges "y" are set by a negative or positive coefficient.

According to the configuration, a filtering characteristic using negative and positive coefficients can be realized by use of negative electric charges.

A radio communication device of the present invention includes the sampling filter of the present invention that subjects a radiofrequency signal input from an antenna to discretization and filtering; a buffer section that converts amounts of electric charges accumulated in the integrators in the sampling filter into voltages and outputs the voltages; an A-D section that digitizes the analogue signal output from the buffer section; and a baseband section that subjects the signal digitized by the A-D section to demodulation or decoding.

According to the configuration, a radio communication device using the sampling filter of the present invention can be realized.

A radio communication device of the present invention corresponds to a radio communication device comprising the sampling filter of the present invention that subjects a radiofrequency signal input from an antenna to discretization and filtering, and that changes amounts of electric charges accumulated in the integrators according to a first radio communication scheme or a second radio communication scheme; a buffer section that converts amounts of electric charges accumulated in the integrators in the sampling filter into voltages and outputs the voltages; an A-D section that digitizes the analogue signal output from the buffer section; a switch section that switches an output from the A-D section according to the first or second communication scheme; a first baseband section that conforms to the first radio communication scheme, and that subjects a digital signal output from the A-D section through the switch section to demodulation or decoding; and a second baseband section that conforms to the second radio communication scheme, and that subjects a digital signal output from the A-D section through the switch section to demodulation or decoding.

According to the configuration, a radio communication device conforming to a plurality of radio communication schemes can be implemented by means of switching the filtering characteristic of the sampling filter.

ADVANTAGE OF THE INVENTION

According to the sampling filter of the present invention, electric charges are subjected, while being weighted, to addition and convolution when output rather than a control signal being changed, whereby a sampling filter that does not require a complicate control section can be provided.

BRIEF DESCRIPTION OF THE DRAWINGS

[FIG. 3] A table showing control timings of the first embodiment of the present invention

[FIG. 14] A table showing control timings of the first embodiment of the present invention

Figure 1:
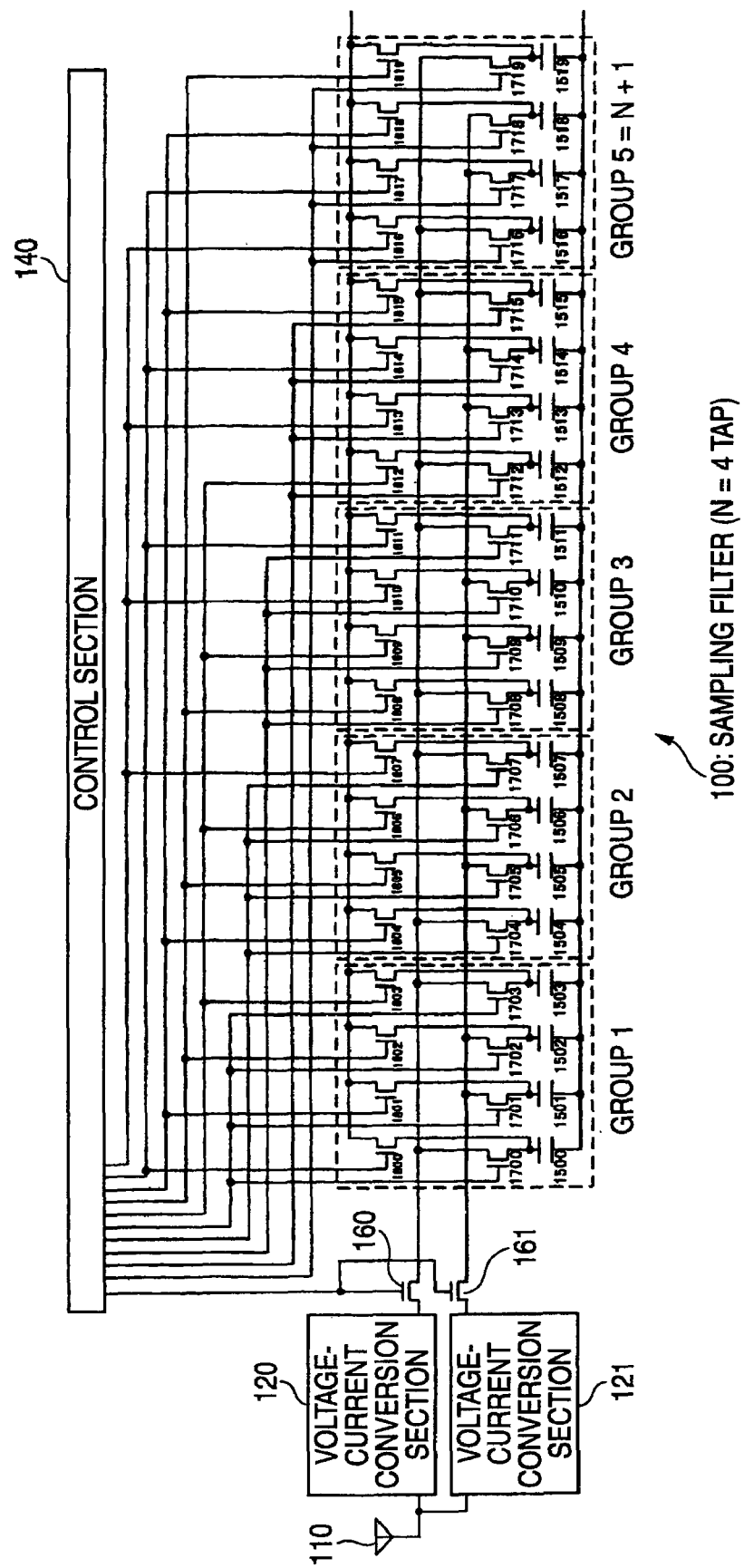
[FIG. 1] A view showing the configuration of a sampling filter of a first embodiment of the present invention

DESCRIPTIONS OF THE REFERENCE NUMERALS 100, 101, 102, 103 SAMPLING FILTER
110 ANTENNA
120, 121, 620, 621 VOLTAGE-CURRENT CONVERSION SECTION
630, 631 CHANGEOVER SWITCH
140 CONTROL SECTION
1500 TO 1519 CAPACITOR
160, 161, 360, 361 SAMPLING SWITCH
1700 TO 1719 CHARGE SWITCH
1800 TO 1819 DISCHARGE SWITCH
2500 TO 2519 CAPACITOR
3500 TO 3519 CAPACITOR
3700 TO 3719 CHARGE SWITCH
3800 TO 3819 DISCHARGE SWITCH
200, 300 RADIOCOMMUNICATION DEVICE
201, 301 SAMPLING FILTER SECTION
202, 302 BUFFER SECTION
203, 303 A-D SECTION
204, 305, 306 BASEBAND SECTION

BEST MODES FOR IMPLEMENTING THE INVENTION

Embodiments of the present invention will be described hereunder by reference to the drawings.

First Embodiment

FIG. 1 is a view showing the configuration of a sampling filter according to a first embodiment of the present invention. In FIG. 1, a sampling filter 100 has an antenna 110; voltage-current conversion sections 120 and 121; a control section 140; capacitors 1500 to 1519; sampling switches 160 and 161; charge switches 1700 to 1719; and discharge switches 1800 to 1819.

The antenna 110 receives a radiofrequency signal of a radio system. Although not shown in FIG. 1, a radiofrequency signal received by the antenna 110 is subjected to high-frequency signal processing conforming to a radio system; for example, a filter or the like, and the thus-processed signal is input to the voltage-current conversion sections 120 and 121. The voltage-current conversion sections 120 and 121 convert an input voltage signal into an electric current, and the current is output. The voltage-current conversion sections are; for instance, transconductance amplifiers, and the voltage-current conversion sections 120 and 121 are different from each other in terms of a voltage-current characteristic.

In accordance with a signal input from the control section 140, the sampling switches 160 and 161 sample electric currents input from the respective voltage-current conversion sections 120 and 121 and output the thus-sampled currents to capacitors 1500 to 1519.

When charge switches 1700 to 1719 are in the ON position, the capacitors 1500 to 1519 are charged with electric charges in accordance with the electric currents sampled by the sampling switches 160 and 161. The capacitors 1500, 1503, 1504, 1507, 1508, 1511, 1512, 1515, 1516, and 1519 are charged with electric charges input from the sampling switch 160, and the capacitors 1501, 1502, 1505, 1506, 1509, 1510, 1513, 1514, 1517, and 1518 are charged with electric charges input from the sampling switch 161. When discharge switches 1800 to 1819 are in the ON position, the thus-charged electric charges are output.

In accordance with a charge signal input from the control section 140, the charge switches 1700 to 1719 perform switching as to whether or not to charge the capacitors 1500 to 1519 with electric charges. In accordance with the discharge signal input from the control section 140, discharge switches 1800 to 1819 perform switching as to whether or not to output the electric charges accumulated in the capacitors.

For instance, there will be described a case where the sampling filter 100 has a filtering characteristic of N=4 taps. When the capacitors 1500 to 1519 are charged with electric charges, charge switches 1700 to 1703 (Group 1), charge switches 1704 to 1707 (Group 2), charge switches 1708 to 1711 (Group 3), charge switches 1712 to 1715 (Group 4), and charge switches 1716 to 1719 (Group 5=N+1) are controlled by the same charge signal as shown in FIG. 2, and an ON period of each of the charge signals is T/5, and the ON periods of the respective charge signals are offset from each other by T/5.

Figure 2:
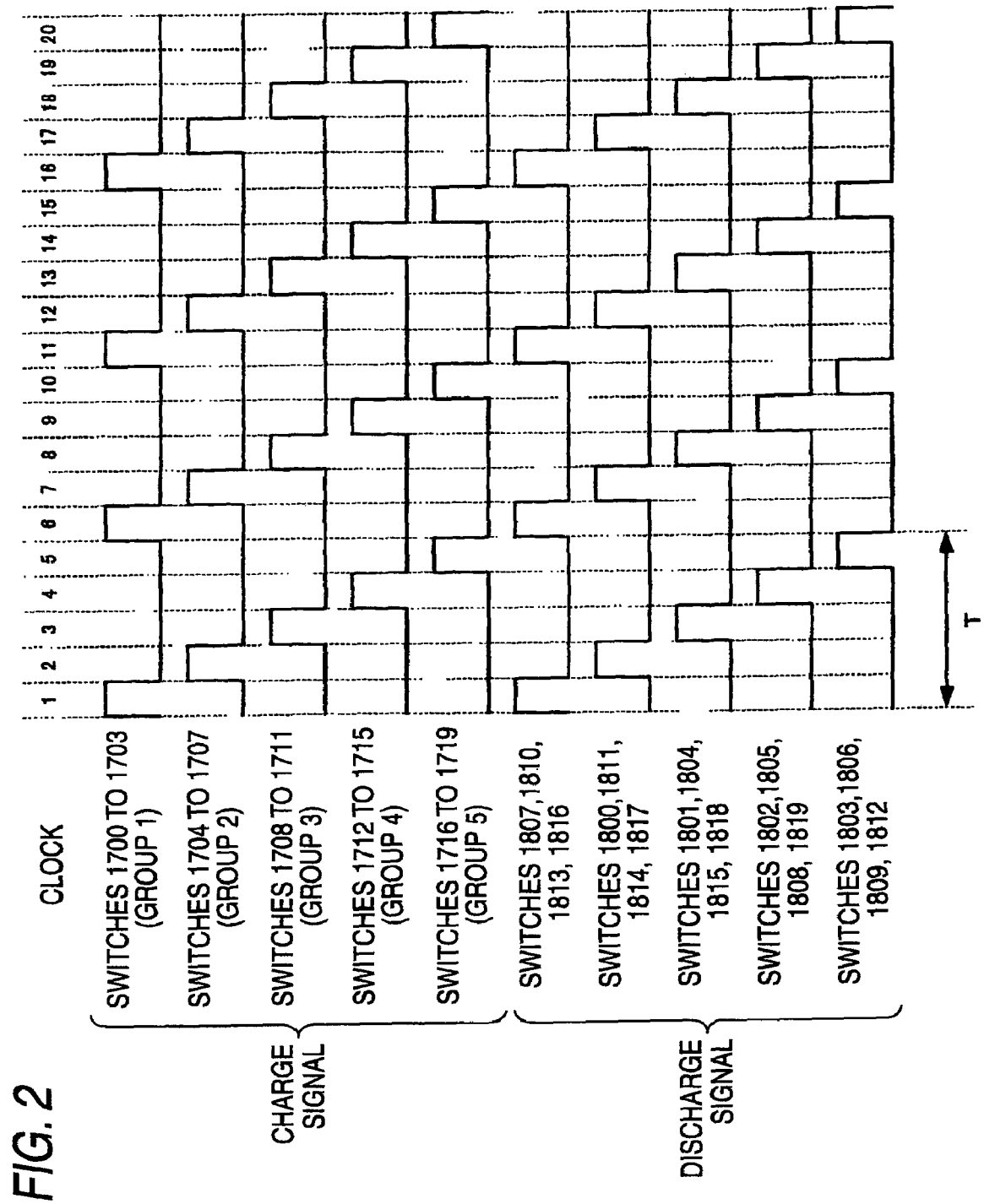
[FIG. 2] A view showing a control signal of a control section of the first embodiment of the present invention

When the electric charges accumulated in the capacitors 1500 to 1519 are output, discharge switches 1807, 1810, 1813, 1816, discharge switches 1800, 1811, 1814, and 1817, discharge switches 1801, 1804, 1815, and 1818, switches 1802, 1805, 1808, and 1819, and discharge switches 1803, 1806, 1809, and 1812, which have been selected one from each of the groups except a group in a charging process are controlled by the same discharge signal as shown in FIG. 2. An ON period of each of the discharge signals is T/5, and the ON periods of the respective discharge signals are offset from each other by T/5.

FIG. 3 is a table showing timings at which the charge switches 1700 to 1719 and the discharge switches 1800 to 1819 are turned on. Timing 1 of a clock signal designates a period from 0 to T/5; timing 2 designates a period from T/5 to 2×T/5; and timing L designates a period from (L−1)×T/5 to L×T/5.

The charge switches 1700 to 1703 are turned on at timing 1, thereby charging the capacitors 1500 to 1503 (Group 1) with electric charges. Further, the discharge switches 1807, 1810, 1813, and 1816 are turned on at the same timing, thereby outputting the electric charges accumulated in the capacitors 1507 (Group 2), 1510 (Group 3), 1513 (Group 4), and 1516 (Group 5).

The charge switches 1704 to 1707 are turned on at timing 2, thereby charging the capacitors 1504 to 1507 (Group 2) with electric charges. Further, the discharge switches 1800, 1811, 1814, and 1817 are turned on at the same timing, thereby outputting the electric charges accumulated in the capacitors 1500 (Group 1), 1511 (Group 3), 1514 (Group 4), and 1517 (Group 5).

The charge switches 1708 to 1711 are turned on at timing 3, thereby charging the capacitors 1508 to 1511 (Group 3) with electric charges. Further, the discharge switches 1801, 1804, 1815, and 1818 are turned on at the same timing, thereby outputting the electric charges accumulated in the capacitors 1501 (Group 1), 1504 (Group 2), 1515 (Group 4), and 1518 (Group 5).

The charge switches 1712 to 1715 are turned on at timing 4, thereby charging the capacitors 1512 to 1515 (Group 4) with electric charges. Further, the discharge switches 1802, 1805, 1808, and 1819 are turned on at the same timing, thereby outputting the electric charges accumulated in the capacitors 1502 (Group 1), 1505 (Group 2), 1508 (Group 3), and 1519 (Group 5).

The charge switches 1716 to 1719 are turned on at timing 5, thereby charging the capacitors 1516 to 1519 (Group 5) with electric charges. Further, the discharge switches 1803, 1806, 1809, and 1812 are turned on at the same timing, thereby outputting the electric charges accumulated in the capacitors 1503 (Group 1), 1506 (Group 2), 1509 (Group 3), and 1512 (Group 4).

Processing pertaining to the timings 1 through 5 is repeated at timing 6 and subsequent timings.

As mentioned above, at each timing (e.g., timing 5), the electric charges stored in one capacitor of the group (Group 4) subjected to charging at previous timing, the electric charges stored in one capacitor of the group (Group 3) subjected to charging at second previous timing, the electric charges stored in one capacitor of the group (Group 2) subjected to charging at third previous timing, and the electric charges stored in one capacitor of the group (Group 1) subjected to charging at fourth previous timing are simultaneously output at the same timing where all capacitors of a certain group (Group 5) are charged with electric charges.

The sampling switches 160 and 161 are controlled so as to perform sampling operation at a cycle of T/5, and the charge switches 1700 to 1719 and the discharge switches 1800 to 1819 are controlled as shown in FIG. 3. As a result, provided that electric charges accumulated in the capacitors 1500, 1503, 1504, 1507, 1508, 1511, 1512, 1515, 1516, and 1519 from the voltage-current conversion section 120 during the period in which the charge switches 1700 to 1719 are in the ON position are $a_1$ and that electric charges accumulated in the capacitors 1501, 1502, 1505, 1506, 1509, 1510, 1513, 1514, 1517, and 1518 from the voltage-current conversion section 121 are $a_2$, an output "y" from the sampling filter section 100 is expressed by (Mathematical Expression 1) that is the same as that of an FIR filter which is a digital filter.

$$y = a_1 + a_2 z^{-1} + a_2 z^{-2} + a_1 z^{-3} \quad \text{[Mathematical Expression 1]}$$

Figure 4:
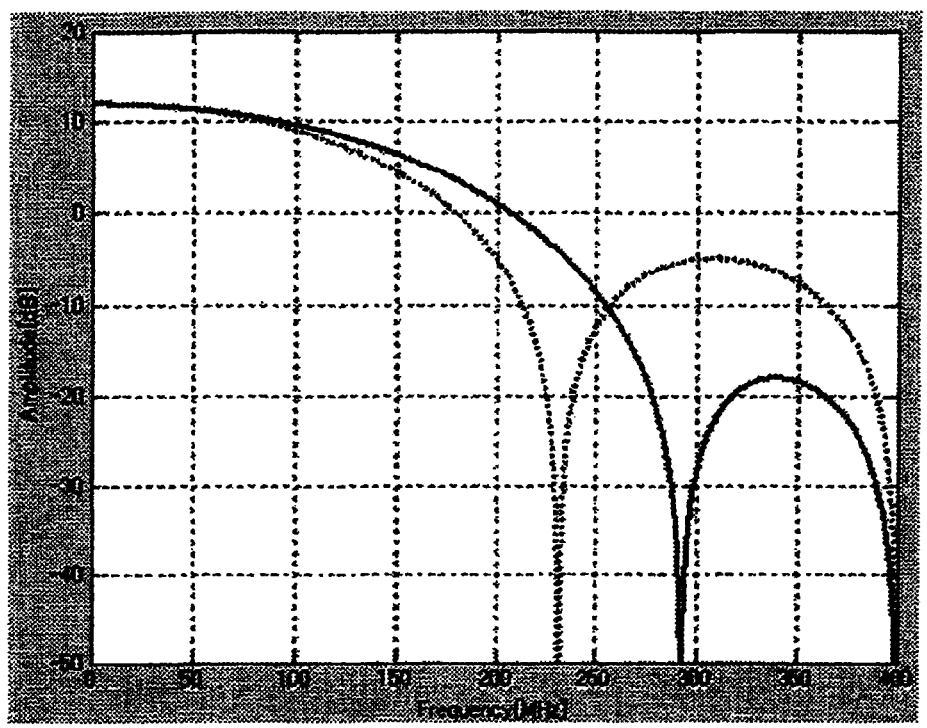
[FIG. 4] A view (1) showing a frequency characteristic of the sampling filter of the first embodiment of the present invention

A solid line in FIG. 4 designates a filtering characteristic achieved in a case where 5/T is 800 [MHz]; where $a_1$ is 0.6; and where $a_2$ is 1.4. A dotted line in FIG. 4 designates a case where $a_1$ is 0.8 and where $a_2$ is 1.2. As mentioned above, the characteristic of the filter can be changed by changing the values of $a_1$ and $a_2$.

Figure 5:
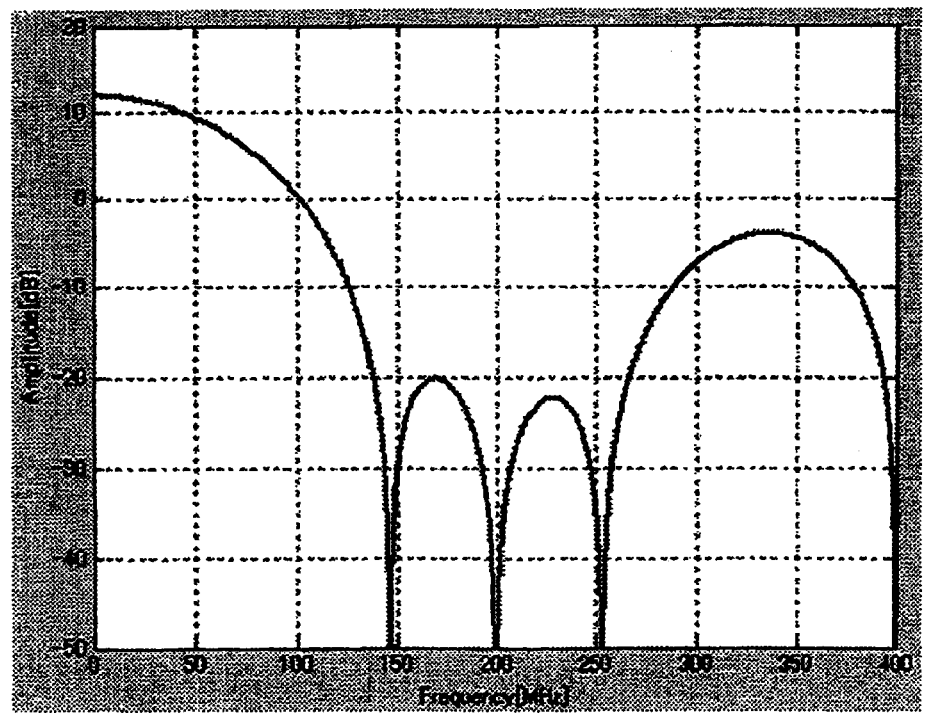
[FIG. 5] A view (2) showing a frequency characteristic of the sampling filter of the first embodiment of the present invention

The sampling switches 160 and 161 are controlled so as to perform sampling operation at a cycle of T/10, whereupon a filtering characteristic shown in FIG. 5 is acquired. Specifically, the filtering characteristic can be changed by altering sampling cycles of the sampling switches 160 and 161 or switching cycles of the charge switches 1700 to 1719 and the discharge switches 1800 to 1819.

When N assumes an even number (N=2M), the sampling filter 100 can constitute an N-tap filter by including N/2(=M) voltage-current conversion sections, N×(N+1) capacitors, N×(N+1) switches for accumulating electric charges, and N×(N+1) switches for outputting electric charges, namely, (N+1) groups, each of which consists of N capacitors, N charge switches, and N discharge switches. In that case, an output "y" from the sampling filter 100 is expressed by (Mathematical Expression 2).

$$y = a_1 + a_2 z^{-1} + \ldots + a_M z^{-M+1} + a_M z^{-M} + \ldots + a_2 z^{-N+2} + a_1 z^{-N+1} \quad \text{[Mathematical Expression 2]}$$

When N assumes an odd number (N=2M−1), the sampling filter 100 is configured so as to include (N+1)/2(=M) voltage-current conversion sections, thereby enabling formation of an N-tap filter. In this case, the output "y" from the sampling filter 100 is expressed by (Mathematical Expression 3).

$$y = a_1 + a_2 z^{-1} + \ldots + a_{M-1} z^{-M+2} + a_M z^{-M+1} + a_{M-1} z^{-M} \ldots + a_2 z^{-N+2} + a_2 z^{-N+2} + a_1 z^{-N+1} \quad \text{[Mathematical Expression 3]}$$

According to such a configuration, only a rectangular wave is used as a control signal. Further, when accumulated electric charges are output, the charges are controlled so as to undergo, while being weighting, addition and convolution, thereby enabling realization of a sampling filter having the same filtering characteristic as that of an FIR filter that is a digital filter.

Figure 6:
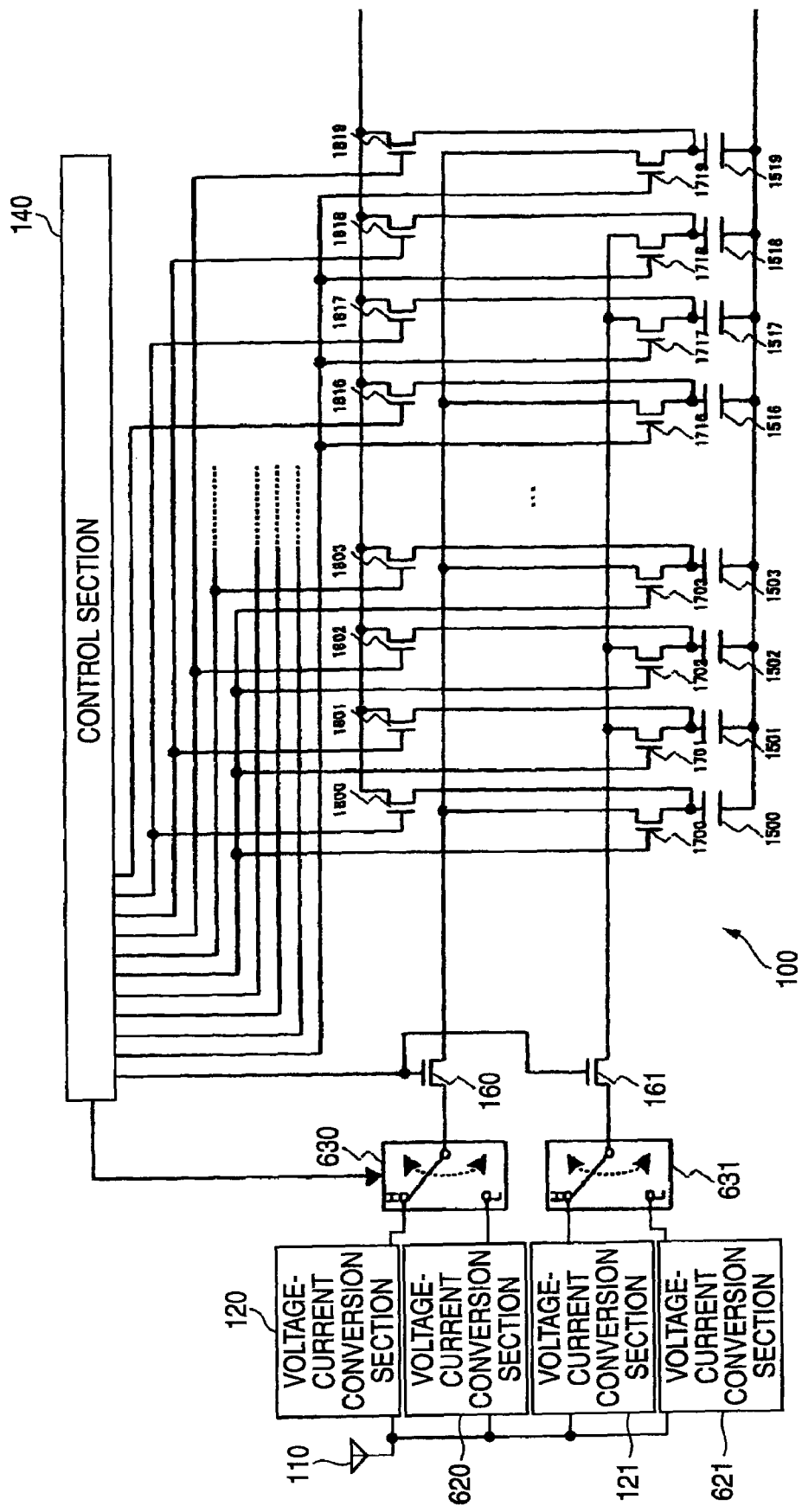
[FIG. 6] A view showing the configuration of a sampling filter of the first embodiment of the present invention
Figure 7:
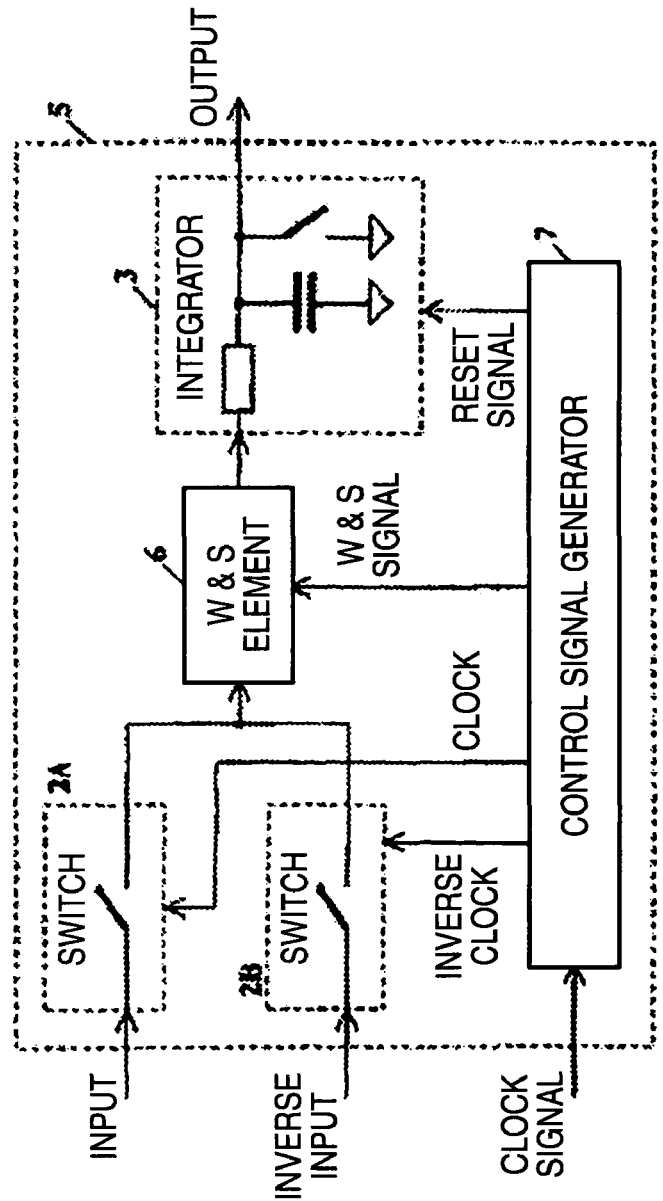
[FIG. 7] A view showing the configuration of a related-art sampling filter

As shown in FIG. 6, the sampling filter 100 is additionally provided with voltage-current conversion sections 620 and 621 and changeover switches 630 and 631, so that amounts of electric charges accumulated in capacitors can be changed by switching the voltage-current conversion sections.

Electric charges accumulated in the capacitors 1500, 1503, 1504, 1507, 1508, 1511, 1512, 1515, 1516, and 1519 by the voltage-current conversion section 120 during a period in which the charge switches 1700 to 1719 are in the ON position are taken as "$a_1$" (=0.6). Electric charges accumulated in the capacitors 1501, 1502, 1505, 1506, 1509, 1510, 1513, 1514, 1517, and 1518 by the voltage-current conversion section 121 during the same period are taken as "$a_2$" (=1.4). Electric charges accumulated in the capacitors 1500, 1503, 1504, 1507, 1508, 1511, 1512, 1515, 1516, and 1519 by the voltage-current conversion section 620 during the same period are taken as "$a_3$" (=0.8). Electric charges accumulated in the capacitors 1501, 1502, 1505, 1506, 1509, 1510, 1513, 1514, 1517, and 1518 by the voltage-current conversion section 621 during the same period are taken as "$a_4$" (=1.2). As a result of, for instance, the sampling switches 160 and 161 being controlled so as to perform sampling operation at a cycle of T/5 and the charge switches 1700 to 1719 and the discharge switches 1800 to 1819 being controlled as shown in FIG. 3, the filtering characteristic can be switched to one designated by a solid line in FIG. 4 when the changeover switches 630 and 631 are in the H level, and the filtering characteristic can be switched to one designated by a dotted line in FIG. 4 when the changeover switches 630 and 631 are in the L level.

Moreover, when the dynamic range of the voltage-current conversion characteristic of the voltage-current conversion section is wide, changing of amounts of electric charges accumulated in the capacitors and switching of the filtering characteristic can also be performed by switching an internal voltage of the voltage-current conversion section rather than the voltage-current conversion section shown in FIG. 6.

The number of voltage-current conversion sections shown in FIGS. 1 and 6 and a configuration for changing an interval voltage are determined in accordance with a dynamic range required as a coefficient of (Mathematical Expression 2) and a switching rate, such as a required internal voltage. For instance, when coefficients $a_1$, $a_2$, $a_3$, and $a_4$ shown in FIG. 6 are prepared, the coefficients $a_1$ and $a_3$ are realized by switching the voltage-current characteristic of the voltage-current conversion section 120, and the coefficients $a_2$ and $a_4$ are implemented by switching the voltage-current conversion section 121 and the voltage-current conversion section 621, thereby constituting the voltage-current conversion section in number of three.

By the configuration, only a rectangular wave is used as a control signal. Further, when the accumulated electric charges are output, the charges are controlled so as to undergo, while being weighted, addition and convolution, thereby enabling changing of the filtering characteristic of the sampling filter.

A sinusoidal waveform rather than a rectangular waveform may also be accepted as the control signal, and no specific limitations are imposed on a sequence where the switches that output electric charges are controlled (e.g., a sequence of 1803→1802→1801→1800 in lieu of a sequence of 1800→1801→1802→1803 may also be acceptable). Further, the capacitance of the capacitors 1500, 1503, 1504, 1507, 1508, 1511, 1512, 1515, 1516, and 1519 and the capacitance of the capacitors 1501, 1502, 1505, 1506, 1509, 1510, 1513, 1514, 1517, and 1518 are respectively set to different values, so that a configuration from which the voltage-current conversion section 121 is omitted also becomes feasible.

Figure 8:
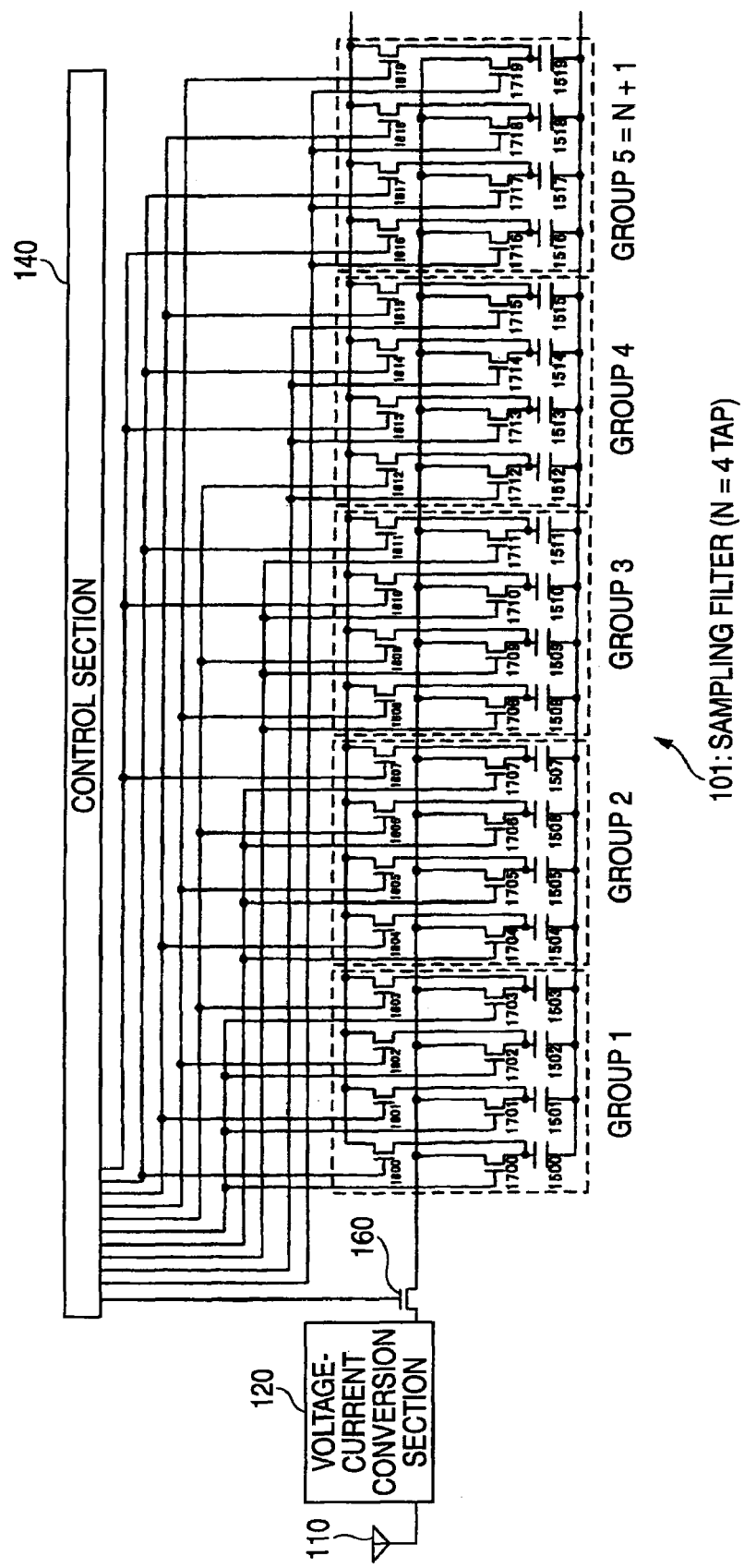
[FIG. 8] A view showing the configuration of a sampling filter of the first embodiment of the present invention

FIG. 8 is a view showing a configuration in which the voltage-current conversion section 121 is omitted from the sampling filter 100 shown in FIG. 1. In a sampling filter 101 shown in FIG. 8, the capacitance of the capacitors 1500, 1503, 1504, 1507, 1508, 1511, 1512, 1515, 1516, and 1519 and the capacitance of the capacitors 1501, 1502, 1505, 1506, 1509, 1510, 1513, 1514, 1517, and 1518 are different from each other. Electric charges accumulated in the capacitors 1500, 1503, 1504, 1507, 1508, 1511, 1512, 1515, 1516, and 1519 by the voltage-current conversion section 120 during a period in which the charge switches 1700 to 1719 are in the ON position are taken as "$a_1$" (=0.6). Electric charges accumulated in the capacitors 1501, 1502, 1505, 1506, 1509, 1510, 1513, 1514, 1517, and 1518 during the same period are taken as "$a_2$" (=1.4). As a result of, for instance, the sampling switch 160 being controlled so as to perform sampling operation at a cycle of T/5 and the charge switches 1700 to 1719 and the discharge switches 1800 to 1819 being controlled as shown in FIG. 3, the filtering characteristic designated by the solid line in FIG. 4 is achieved.

Figure 9:
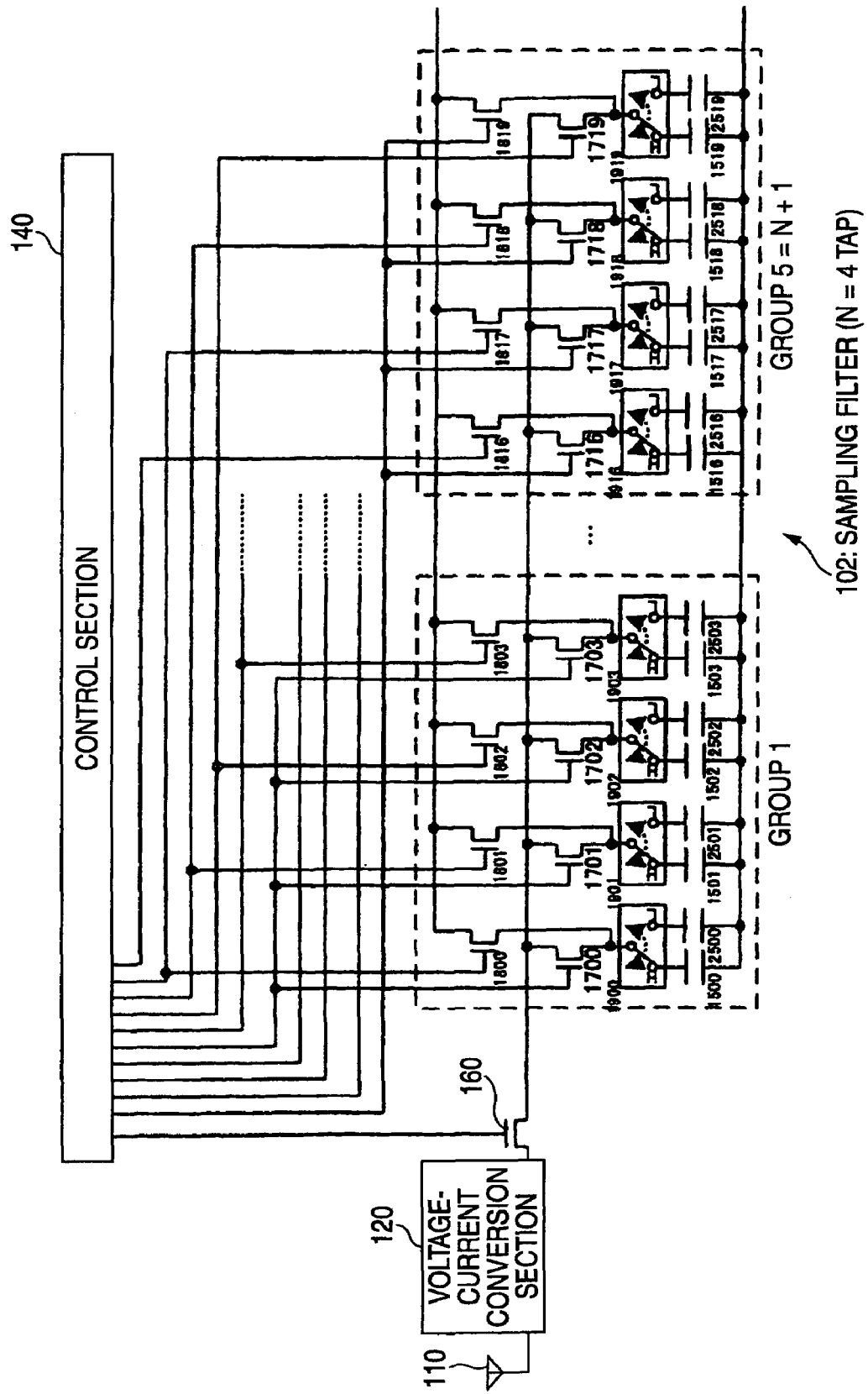
[FIG. 9] A view showing the configuration of a sampling filter of the first embodiment of the present invention

As shown in FIG. 9, the sampling filter 101 shown in FIG. 8 is additionally provided with voltage changeover switches 1900 to 1919 and capacitors 2500 to 2519. The sampling filter may also be configured in such a way that, when the changeover switches 1900 to 1919 are in the H level, the charge switches 1700 to 1719 and the capacitors 1500 to 1519 are connected and that, when the changeover switches 1900 to 1919 are in the L level, the charge switches 1700 to 1719 and the capacitors 1500 to 1519 are connected. Electric charges accumulated in the capacitors 1500, 1503, 1504, 1507, 1508, 1511, 1512, 1515, 1516, and 1519 by the voltage-current conversion section 120 during a period in which the charge switches 1700 to 1719 are in the ON position are taken as "$a_1$" (=0.6). Electric charges accumulated in the capacitors 1501, 1502, 1505, 1506, 1509, 1510, 1513, 1514, 1517, and 1518 during the same period are taken as "$a_2$" (=1.4). Electric charges accumulated in the capacitors 2500, 2503, 2504, 2507, 2508, 2511, 2512, 2515, 2516, and 2519 during the same period are taken as "$a_3$" (=0.8). Electric charges accumulated in the capacitors 2501, 2502, 2505, 2506, 2509, 2510, 2513, 2514, 2517, and 2518 during the same period are taken as "$a_4$" (=1.2). As a result of, in the sampling filter 102 shown in FIG. 9, the sampling switch 160 being controlled so as to perform sampling operation at a cycle of T/5 and the charge switches 1700 to 1719 and the discharge switches 1800 to 1819 being controlled as shown in FIG. 3, a filtering characteristic can be switched to one designated by the solid line in FIG. 4 when the changeover switches 1900 to 1919 are in the H level, and a filtering characteristic can be switched to one designated by the dotted line in FIG. 4 when the changeover switches 1900 to 1919 are in the L level.

In the above descriptions, control that does not perform decimation by outputting the electric charges accumulated at respective timings has been described. However, control operation that performs decimation is also be feasible by controlling a timing at which the electric charges accumulated in the respective capacitors are output.

Figure 13:
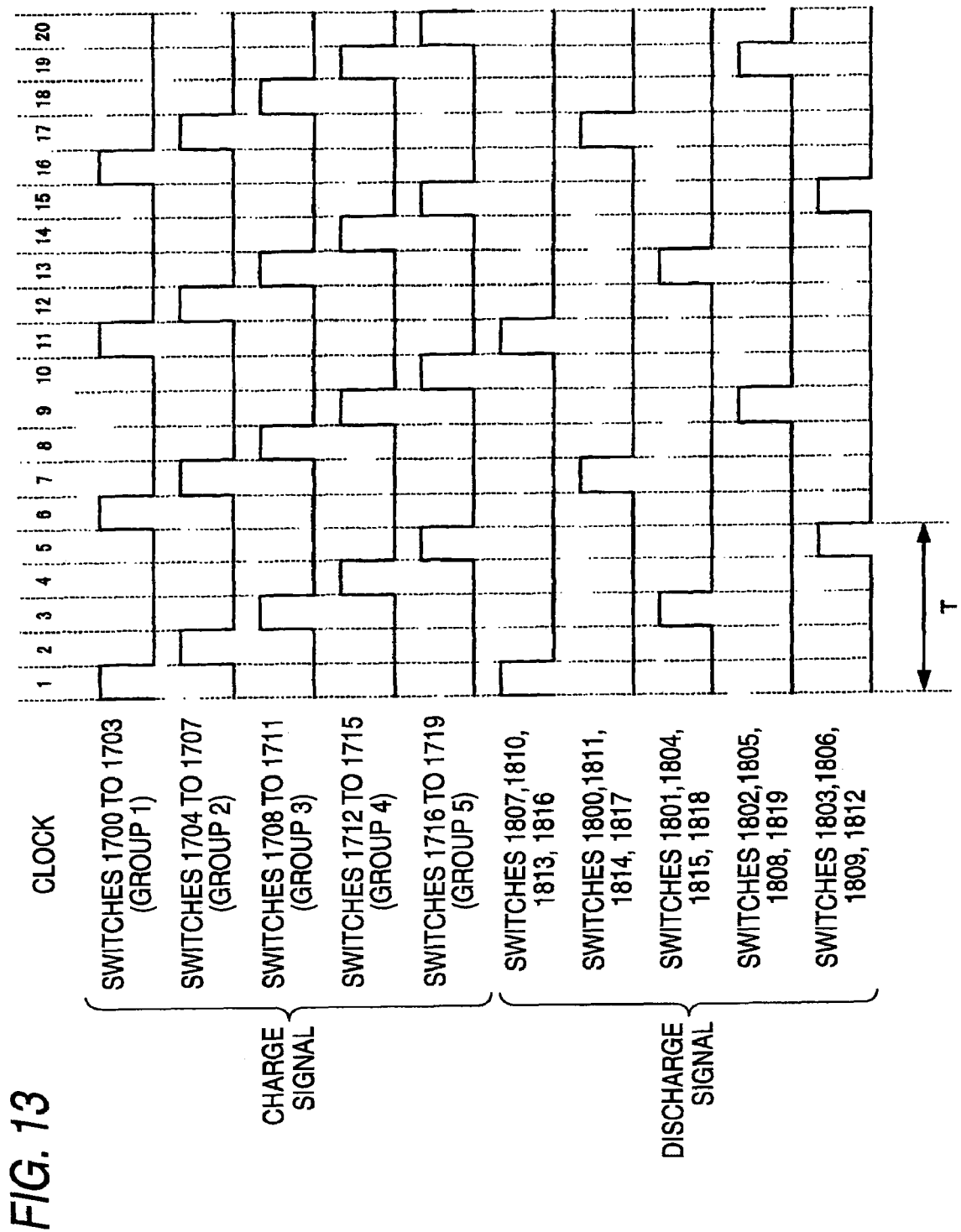
[FIG. 13] A view showing a control signal of a control section of the first embodiment of the present invention

FIG. 13 shows control signals for the respective switches, showing timings at which the respective switches are turned on or off. FIG. 14 is a table showing timings at which the respective switches are turned on. FIG. 13 differs from FIG. 2 in terms of timings at which the discharge switches 1800 to 1819 are turned on or off.

In the case of an N=4-tap, when the electric charges accumulated in the respective capacitors are output, a decimation ratio can be set to a value of two by repetition of control operation for outputting the electric charges accumulated in the capacitors 1507, 1510, 1513, and 1516 at timing 1; performing resetting operation at timing 2 without outputting the electric charges accumulated in the capacitors 1500, 1511, 1514, and 1517; outputting the electric charges accumulated in the capacitors 1501, 1504, 1515, and 1518 at timing 3; performing resetting operation at timing 4 without outputting the electric charges accumulated in the capacitors 1502, 1505, 1508, and 1519; outputting the electric charges accumulated in the capacitors 1503, 1506, 1509, and 1512 at timing 5; performing resetting operation at timing 6 without outputting the electric charges accumulated in the capacitors 1507, 1510, 1513, and 1516; outputting the electric charges accumulated in the capacitors 1500, 1511, 1514, and 1517 at timing 7; performing resetting operation at timing 8 without outputting the electric charges accumulated in the capacitors 1501, 1504, 1515, and 1518; outputting the electric charges accumulated in the capacitors 1502, 1505, 1508, and 1519 at timing 9; and performing resetting operation at timing 10 without outputting the electric charges accumulated in the capacitors 1503, 1506, 1609, and 1512. Specifically, the decimation ratio can also be changed by timing control as well as control operation that does not involve performance of decimation.

Second Embodiment

Figure 10:
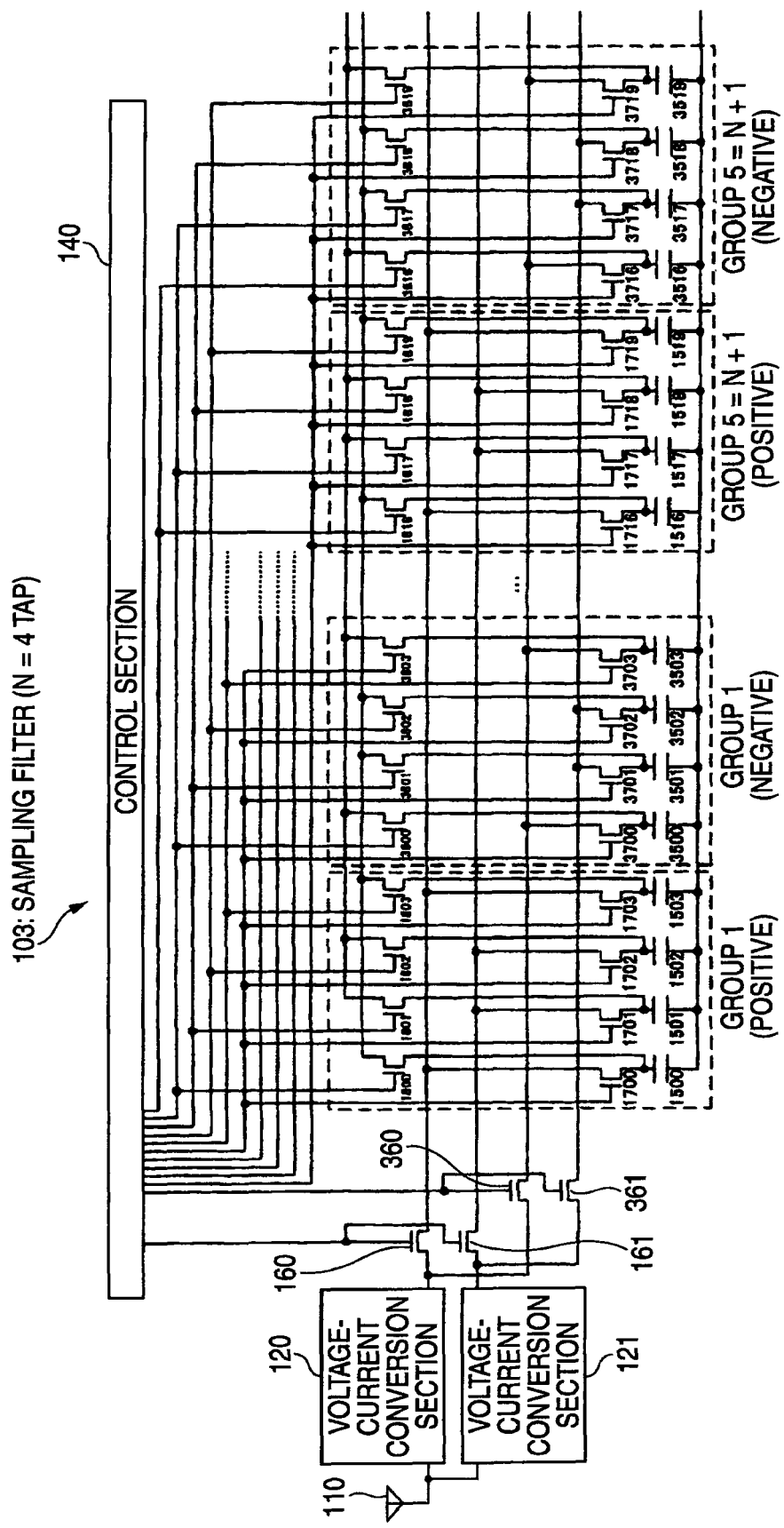
[FIG. 10] A view showing the configuration of a sampling filter of a second embodiment of the present invention

FIG. 10 shows the configuration of a sampling filter of a second embodiment of the present invention. In FIG. 10, a sampling filter 103 has the antenna 110; the voltage-current conversion sections 120 and 121; the control section 140; the capacitors 1500 to 1519 and 3500 to 3519; sampling switches 160, 161, 360, and 361; charge switches 1700 to 1719 and 3700 to 3719; and discharge switches 1800 to 1819 and 3800 to 3819.

Figure 11:
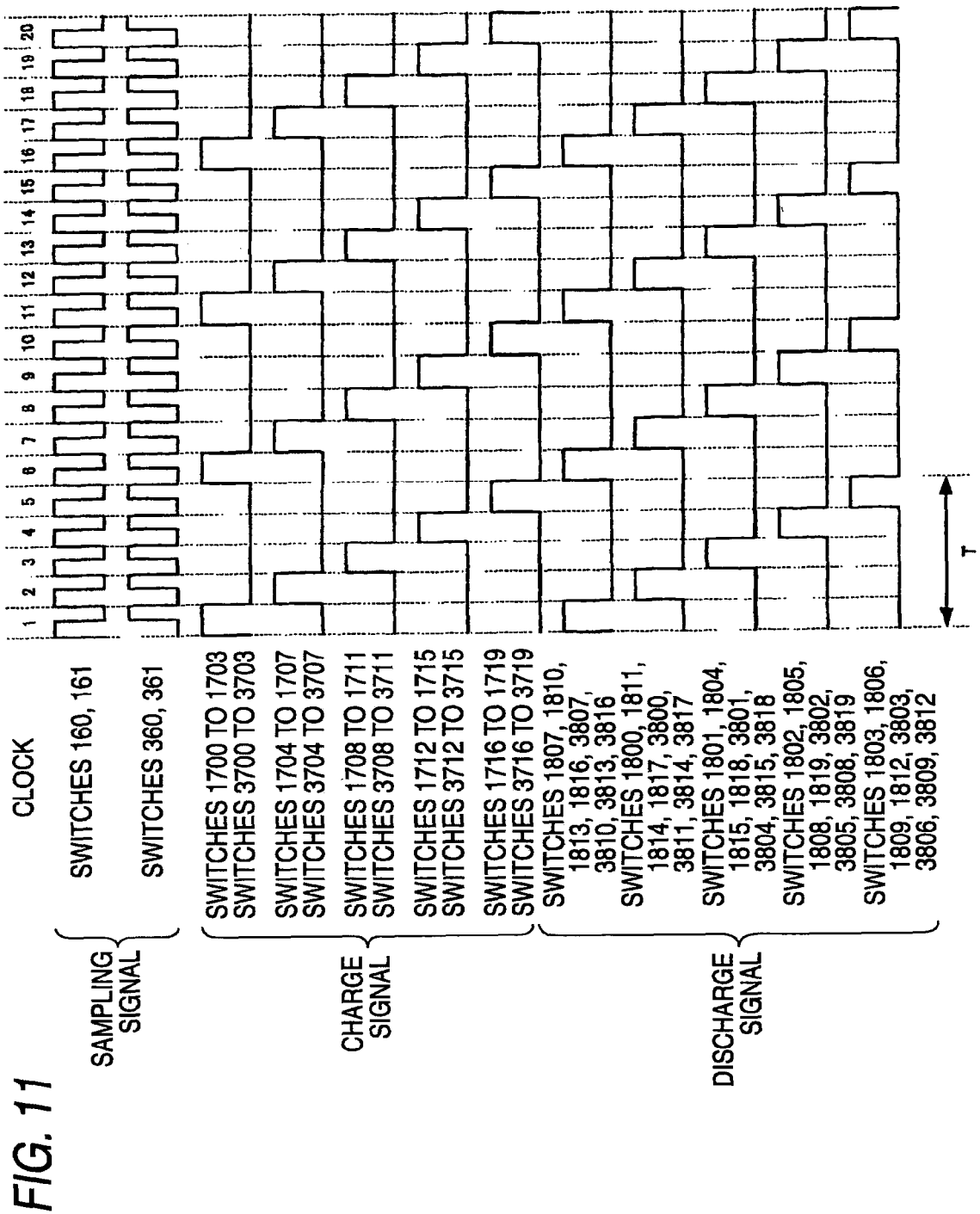
[FIG. 11] A view showing a control signal of a control section of the second embodiment of the present invention

FIG. 11 is a table showing timings at which the respective switches are turned on, and timings of the clock are the same as those shown in FIG. 3. The charge switches 1700 to 1719, the discharge switches 1800 to 1819, and the sampling switches 160 and 161 operate at the same timings as those of the first embodiment.

The active period of the sampling switches 360 and 361 is opposite in phase with the active period of the sampling switches 160 and 161. The periods are 180° out of phase with each other. Specifically, provided that electric charges accumulated in the capacitor 1500 at a certain timing are taken as α, electric charges accumulated in the capacitor 3500 are −α.

The charge switches 3700 to 3703 operate at the same timing as that of the charge switches 1700 to 1703; the charge switches 3704 to 3707 operate at the same timing as that of the charge switches 1704 to 1707; the charge switches 3708 to 3711 operate at the same timing as that of the 1708 to 1711; the charge switches 3712 to 3715 operate at the same timing as that of the charge switches 1712 to 1715; the charge switches 3716 to 3719 operate at the same timing as that of the charge switches 1716 to 1719; and the discharge switches 3807, 3810, 3813, and 3816 operate at the same timing as that of the discharge switches 1807, 1810, 1813, and 1816; the discharge switches 3800, 3811, 3814, and 3817 operate at the same timing as that of the discharge switches 1800, 1811, 1814, and 1817; the discharge switches 3802, 3805, 3808, and 3819 operate at the same timing as that of the discharge switches 1802, 1805, 1808, and 1819; and the discharge switches 1803, 1806, 1809, and 1812 operate at the same timing as that of the discharge switches 3803, 3806, 3809, and 3812.

Electric charges accumulated in the capacitors 1500, 1503, 1504, 1507, 1508, 1511, 1512, 1515, 1516, and 1519 by the voltage-current conversion section 120 during a period in which the charge switches 1700 to 1719 are in the ON position are taken as $a_2$. Electric charges accumulated in the capacitors 3500, 3503, 3504, 3507, 3508, 3511, 3512, 3515, 3516, and 3519 by the voltage-current conversion section 120 during the same period are taken as −$a_1$. Electric charges accumulated in the capacitors 1501, 1502, 1505, 1506, 1509, 1510, 1513, 1514, 1517, and 1518 by the voltage-current conversion section 121 during the same period are taken as $a_2$. Electric charges accumulated in the capacitors 3501, 3502, 3505, 306, 3509, 3510, 3513, 3514, 3517, and 3518 by the voltage-current conversion section 121 during the same period are taken as −$a_2$. As a result of, for instance, the sampling switches 160 and 161 being controlled so as to perform sampling operation at a cycle of T/5 and the charge switches 1700 to 1719, 3700 to 3719 and the discharge switches 1800 to 1819, 3800 to 3819 being controlled as shown in FIG. 11, the output "y" from the sampling filter 103 is expressed by (Mathematical Expression 4) or (Mathematical Expression 5) that is the same expression as that of the FIR filter which is a digital filter.

$$y = -a_1 + a_2 z^{-1} + a_2 Z^{-2} - a_1 Z^{-3}$$ [Mathematical Expression 4]

$$y = a_1 - a_2 z^{-1} - a_2 Z^{-2} + a_1 Z^{-3}$$ [Mathematical Expression 5]

Figure 12:
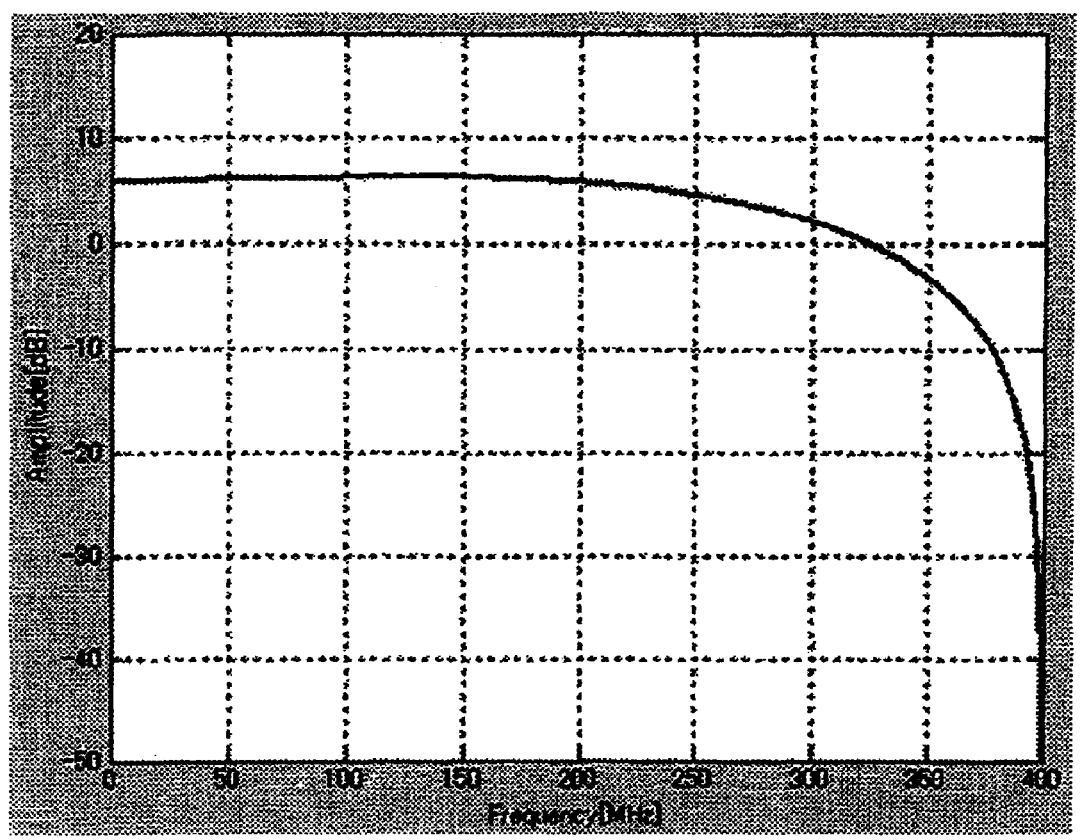
[FIG. 12] A view showing a frequency characteristic of the sampling filter of the second embodiment of the present invention

FIG. 12 shows a filtering characteristic achieved when 5/T is 800 [MHz]; when $a_1$ assumes a value of 0.2; and when $a_2$ assumes a value of 1.2. The same characteristic is achieved by (Mathematical Expression 4) and (Mathematical Expression 5).

In such a configuration, when a sampling filter having the same filtering characteristic as that of the FIR filter which is a digital filter is configured by use of a signal of opposite phase, a negative tap coefficient can also be realized. Adopting the same configuration as those shown in FIGS. 6 and 9 enables realization of a configuration for switching a filtering characteristic. Adopting the same configuration as that shown in FIG. 8 also enables weighting operation by the capacitors.

Third Embodiment

Figure 15:
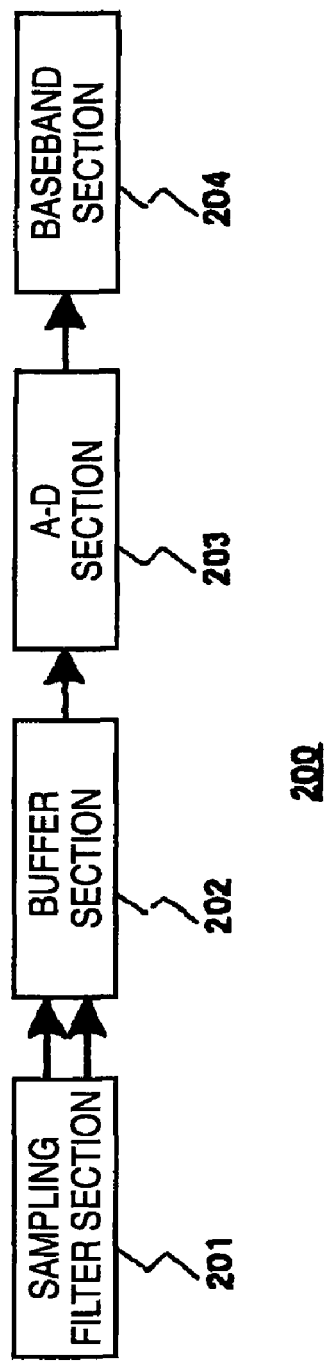
[FIG. 15] A block diagram showing the configuration of a radio communications device of a third embodiment of the present invention

FIG. 15 is a block diagram showing the configuration of a radio communication device of a third embodiment of the present invention. In FIG. 15, a radio communication device 200 has a sampling filter section 201, a buffer section 202, an A-D section 203, and a base band section 204. The sampling filter section 201 has the same configuration as that of the sampling filter 100 of the first embodiment shown in FIG. 1 and operates in the same manner as does the filter, and subjects a radiofrequency signal input from the antenna 110 to discretization and filtering.

The buffer section 202 converts electric charges accumulated in the capacitors 1500 to 1519 of the sampling filter section 201 into voltage values and outputs the thus-converted voltage values. For instance, the buffer section can be constituted of operational amplifiers. When the sampling filter section 201 is constituted as shown in FIG. 10, an output voltage value can be increased by differential operation.

The A-D section 203 digitizes a discretized analogue signal input from the buffer section 202. A baseband section 204 subjects a digital signal input from the A-D section 203 to digital signal processing.

Specifically, the baseband section 204 subjects the signal digitized by the A-D section 203 to demodulation, decoding, and the like. Such a configuration enables application of the sampling filter of the first embodiment to the radio communication device. The sampling filter section 201 can also be configured as shown in FIG. 8.

Fourth Embodiment

Figure 16:
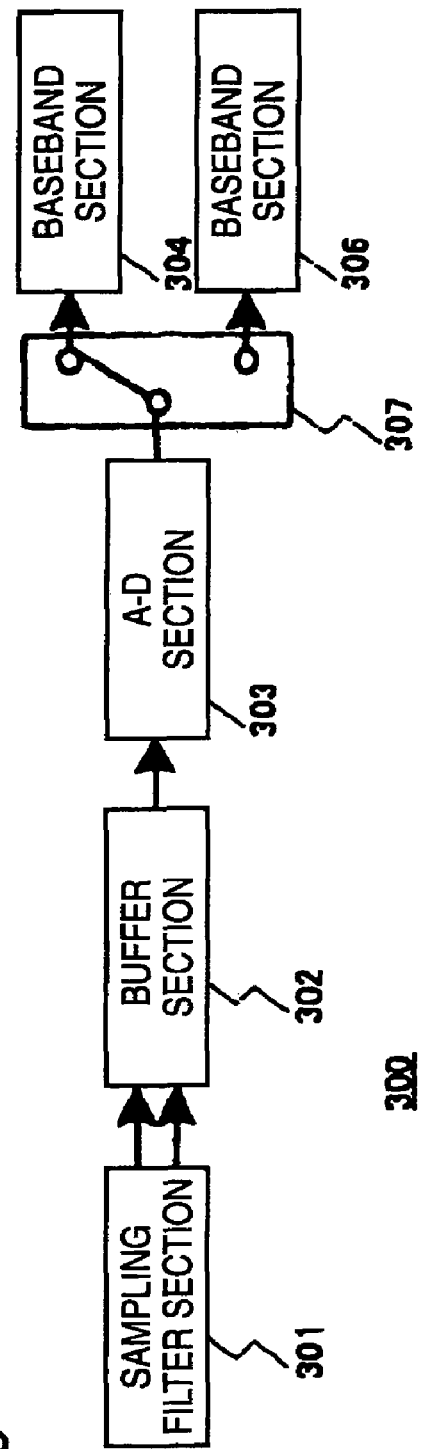
[FIG. 16] A block diagram showing the configuration of a radio communications device of a fourth embodiment of the present invention

FIG. 16 is a block diagram showing the configuration of a radio communication device of a fourth embodiment of the present invention. In FIG. 16, a radio communication device 300 has a sampling filter section 301, a buffer section 302, an A-D section 303, a first baseband section 304, a second baseband section 306, and a switch 307.

The sampling filter section 301 has the same configuration as that of the sampling filter of the first embodiment shown in FIG. 6 and operates in the same manner as does the sampling filter. The sampling filter subjects a radiofrequency signal input from the antenna 110 to discretization and filtering and switches the switches 630 and 631, thereby changing amounts of electric charges accumulated in the capacitors.

The buffer section 302 has the same function as that of the buffer section 202; converts the electric charges accumulated in the capacitors 1500 to 1519 of the sampling filter section 301 into voltage values; and outputs the thus-converted values. The A-D section 303 digitizes the discretized analogue signal input from the buffer section 302. The first baseband section 304 conforms to a first radio communication scheme and subjects a digital signal input from the A-D section 303 to digital signal processing. The second baseband section 306 conforms to a second radio communication scheme and subjects the digital signal input from the A-D section 303 to digital signal processing.

The switch 307 inputs an output from the A-D section 303 to the first baseband section 304 or the second baseband section 306 depending on whether the radio communication scheme is the first radio communication scheme or the second radio communication scheme. In the present embodiment, the A-D section is disposed in a stage prior to the switch 307. However, depending on a radio communication scheme, the A-D section may also be disposed in numbers in a stage subsequent to the switch 307. Further, the sampling filter section 301 can also be configured as shown in FIG. 9.

Such a configuration enables application of the sampling filter of the first embodiment to a radio communication device conforming to a plurality of radio communication schemes.

For instance, the W-CDMA scheme and the IEEE802.11a scheme can be mentioned as examples of the radio communication scheme. Since the bandwidth of the W-CDMA scheme is about 4 MHz and the bandwidth of the IEEE802.11a scheme is about 20 MHz, filters compliant with the respective schemes are required. However, according to the present embodiment, the filtering characteristic of the sampling filter can be varied, and hence a single filter can conform to both of the schemes. Whatever examples of the first radio communication scheme and the second radio communication scheme are acceptable.

Although the present invention has been described in detail by reference to the specific embodiments, it is manifest to those who are versed in the art that the present invention is susceptible to various alterations or modifications without departing from the spirit and scope of the present invention.

The present patent application is based on Japanese Patent Application (JP-A-2005-359190) filed on Dec. 13, 2005 and Japanese Patent Application (JP-A-2006-317276) filed on Nov. 24, 2006 in Japan, contents of which are incorporated herein for reference.

INDUSTRIAL APPLICABILITY

The present invention yields an advantage of the ability to provide a sampling filter that does not require a complicate control section by adoption of a configuration for subjecting electric charges, while being weighted, to addition and convolution at the time of output of the electric charges rather than changing a control signal, and the filter is useful as a filter, or the like, in an analogue circuit of a radio communication device.

The invention claimed is:

1. A sampling filter whose filtering characteristic is determined in accordance with an output from integrators, the filter comprising:
    a plurality of integrators that integrate an electric current;
    charge switches provided at input stages of the integrators;
    discharge switches provided at output stages of the integrators; and
    a control section that controls the charge switches and the discharge switches for each of the integrators, wherein the integrators form (N+1) integrator groups, each of the integrator groups is made up of N (N is an integer of two or more) integrators; and wherein the control section simultaneously performs controls both of charging N integrators belonging to one integrator group selected from the (N+1) integrator groups and adding and outputting electric charges accumulated in N integrators which are selected one by one from each of N integrator groups except the one integrator group being in a charging process.

2. The sampling filter according to claim 1, wherein the control section performs control of charging the N integrators at same timing when the N integrators belonging to the one integrator group are charged; and wherein the control section performs control of discharging electric charges from the N integrators respectively at different timings when the N integrators belonging to the one integrator group are discharged.

3. The sampling filter according to claim 1, wherein the control section performs control of charging N integrators belonging to one integrator group selected from the (N+1) integrator groups and of adding and outputting electric charges accumulated in N integrators which are selected one by one from each of the N integrator groups except the one integrator group being in a charging process every one clock.

4. The sampling filter according to claim 1, further comprising a plurality of current sources, wherein different amounts of electric charges are input to the plurality of integrators every one clock.

5. The sampling filter according to claim 1, wherein the control section performs control so that output electric charges "y" are expressed as follows:

$$y = a_1 + a_2 z^{-1} + \ldots + a_2 z^{-N+2} + a_1 z^{-N+1},$$

where $1 \leq M \leq (N/2)$ N=2M: an even number; and $1 \leq M \leq ((N+1)/2)$ N=2M−1: an odd number, wherein electric charges integrated by the plurality of integrators in one clock are $a_1$ to $a_M$.

6. The sampling filter according to claim 5, wherein the control section charges different integrators with positive electric charges and negative electric charges in one clock so that output electric charges "y" are set by a negative or positive coefficient.

7. The sampling filter according to claim 1, further comprising:

a plurality of current sources, wherein the control section switches an electric current input to the integrators by switching the current sources.

8. The sampling filter according to claim 1, further comprising:

a current source, wherein the control section switches an electric current input to the integrators by switching a voltage-current characteristic of the current source.

9. The sampling filter according to claim 1, further comprising:

a current source, wherein the integrators have different capacitance values to each other; and wherein the control section switches an electric current input to the integrators by switching the integrators.

10. The sampling filter according to claim 9, further comprising:

a plurality of changeover switches for switching the integrators.

11. The sampling filter according to claim 1, wherein the control section performs control operation so as to perform resetting operation without outputting electric charges accumulated in the integrators at a predetermined timing.

12. A radio communication device, comprising:

the sampling filter, as set forth in claim 1, that subjects a radiofrequency signal input from an antenna to discretization and filtering;

a buffer section that converts amounts of electric charges accumulated in the integrators in the sampling filter into voltages and outputs the voltages;

an A-D section that digitizes the analogue signal output from the buffer section; and a baseband section that subjects the signal digitized by the A-D section to demodulation or decoding.

13. A radio communication device, comprising:

the sampling filter, as set forth in claim 1, that subjects a radiofrequency signal input from an antenna to discretization and filtering, and changes amounts of electric charges accumulated in the integrators according to a first radio communication scheme or a second radio communication scheme;

a buffer section that converts amounts of electric charges accumulated in the integrators in the sampling filter into voltages and outputs the voltages;

an A-D section that digitizes the analogue signal output from the buffer section;

a switch section that switches an output from the A-D section according to the first and second radio communication scheme;

a first baseband section that conforms to the first radio communication scheme, and that subjects a digital signal output from the A-D section through the switch section to demodulation or decoding; and a second baseband section that conforms to the second radio communication scheme, and that subjects a digital signal output from the A-D section through the switch section to demodulation or decoding.

* * * * *